(12) United States Patent
Swanson

(10) Patent No.: US 6,503,838 B1
(45) Date of Patent: Jan. 7, 2003

(54) INTEGRATED CIRCUIT ISOLATION OF FUNCTIONALLY DISTINCT RF CIRCUITS

(75) Inventor: Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 299 days.

(21) Appl. No.: 09/677,728

(22) Filed: Oct. 2, 2000

Related U.S. Application Data

(60) Provisional application No. 60/174,194, filed on Dec. 31, 1999.

(51) Int. Cl.[7] .............................................. H01L 21/00
(52) U.S. Cl. ..................... 438/692; 438/719; 438/723; 438/735; 438/745
(58) Field of Search ............................... 438/692, 719, 438/723, 735, 743, 745, 753, 756; 216/38, 67, 79, 88

(56) References Cited

U.S. PATENT DOCUMENTS 5,872,059 A * 2/1999 Doan et al. ............. 438/719 X
5,994,231 A * 11/1999 Sonego et al. .......... 438/723 X

* cited by examiner

*Primary Examiner*—William A. Powell
(74) *Attorney, Agent, or Firm*—Jacqueline J. Garner; W. James Brady, III; Frederick J. Telecky, Jr.

(57) ABSTRACT

A method of fabricating an integrated circuit having active components, conductors and isolation regions on a substrate is disclosed, including forming a portion of an isolation region to expose a first area of the substrate, depositing a mask layer over the integrated circuit including the first area, forming the mask layer to expose a second area of the substrate within the first area, converting a portion of the substrate to a selectively etchable material in an area subjacent to the second area and extending only partially to the bottom surface of the substrate, selectively etching this etchable material to form a void, removing the mask layer to expose the isolation region, depositing a conductive layer over all exposed surfaces of the substrate comprising the void and the isolation region, depositing a dielectric layer over the conductive layer extending at least to the height of the isolation region, polishing the surface of the dielectric layer until the surface is planar and the top surface of the isolation region is exposed, and forming at least one patterned conductive layer over the surface of the dielectric layer that is coplanar with the surface of the isolation region.

20 Claims, 10 Drawing Sheets

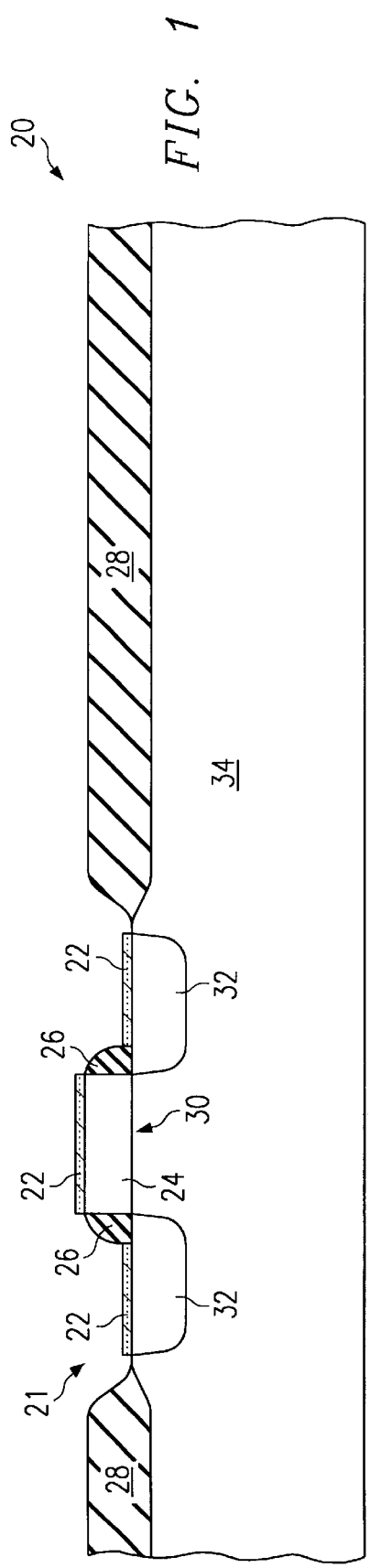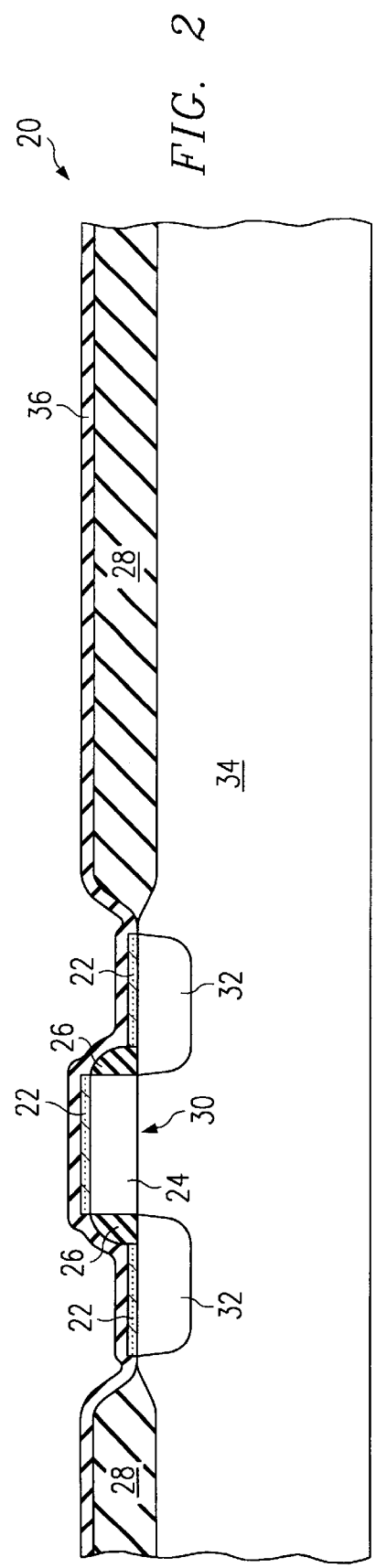

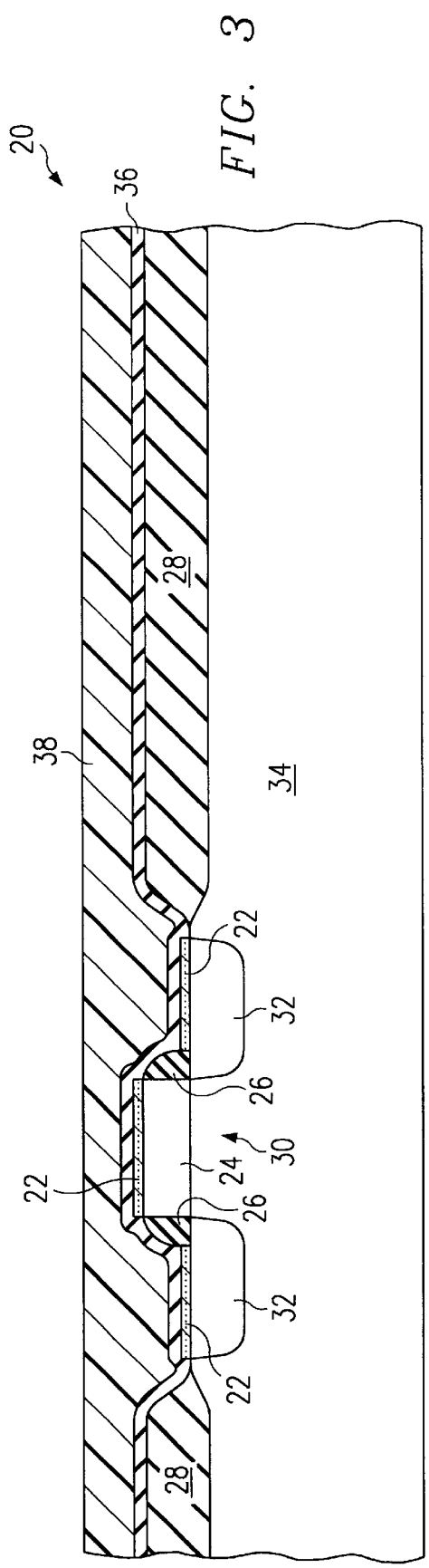
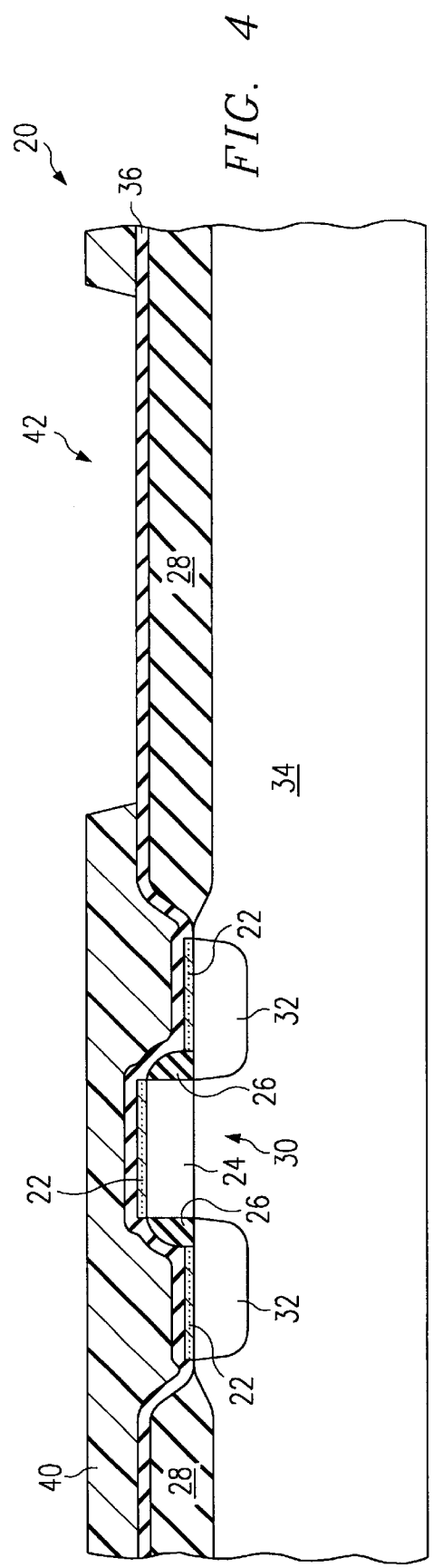

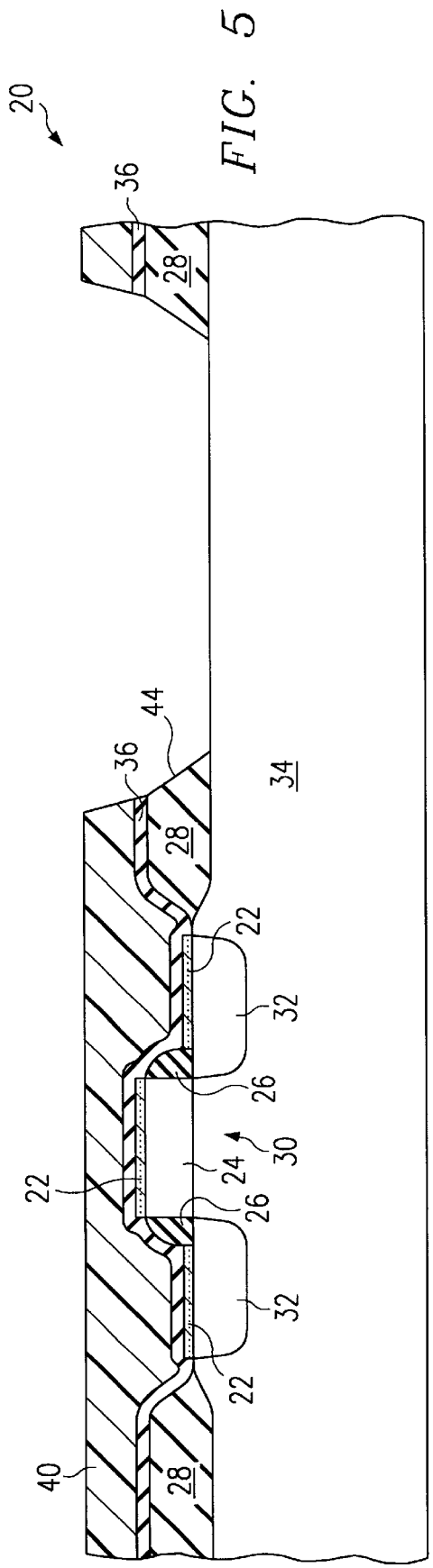
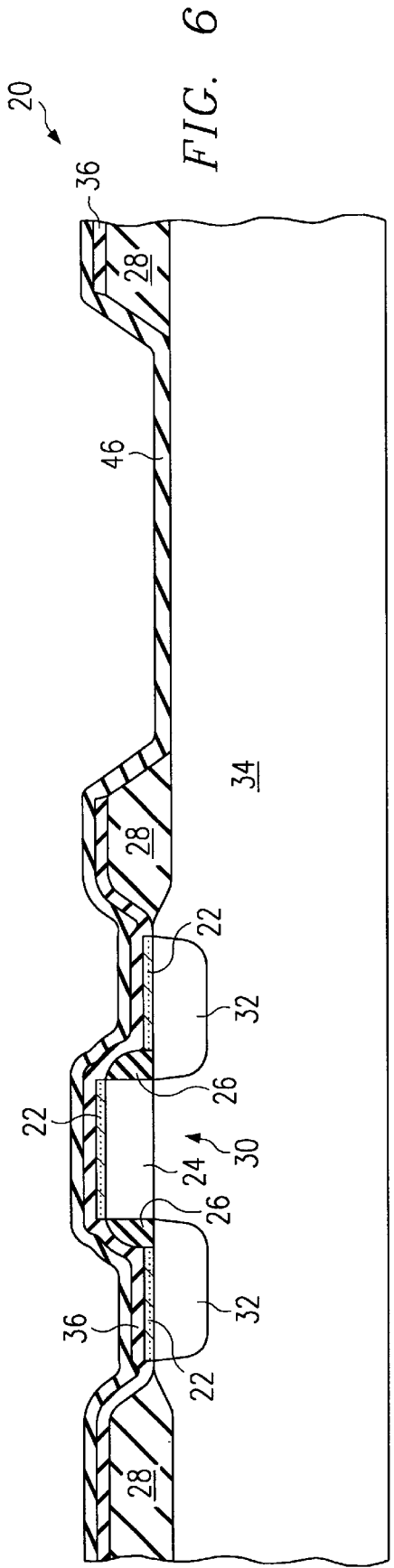

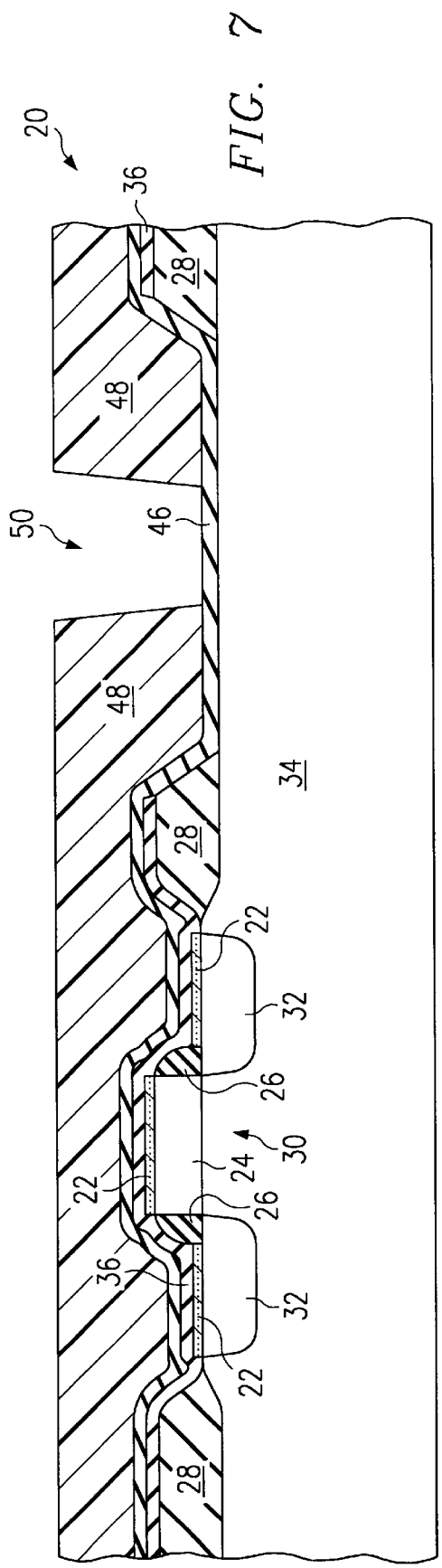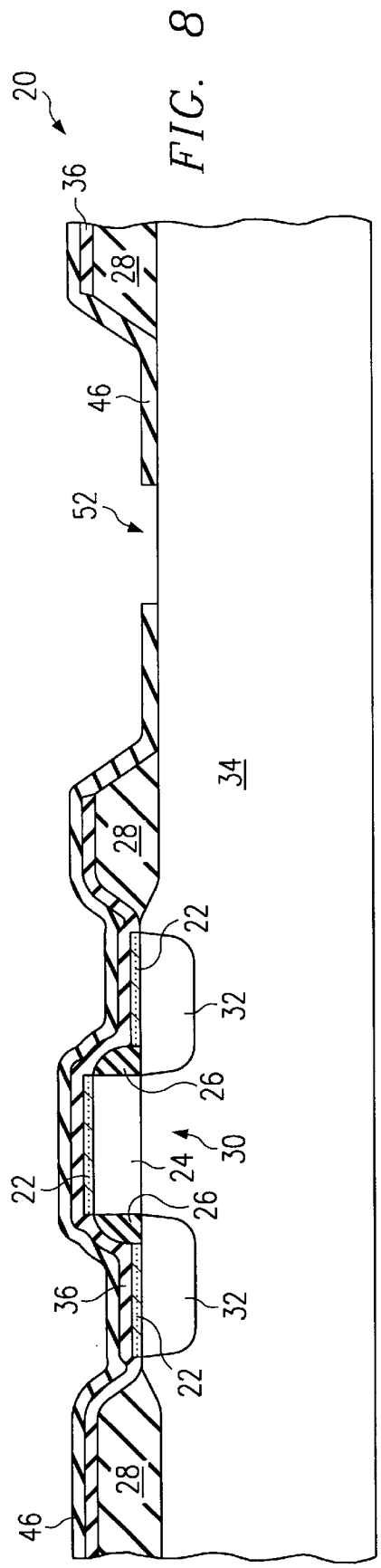

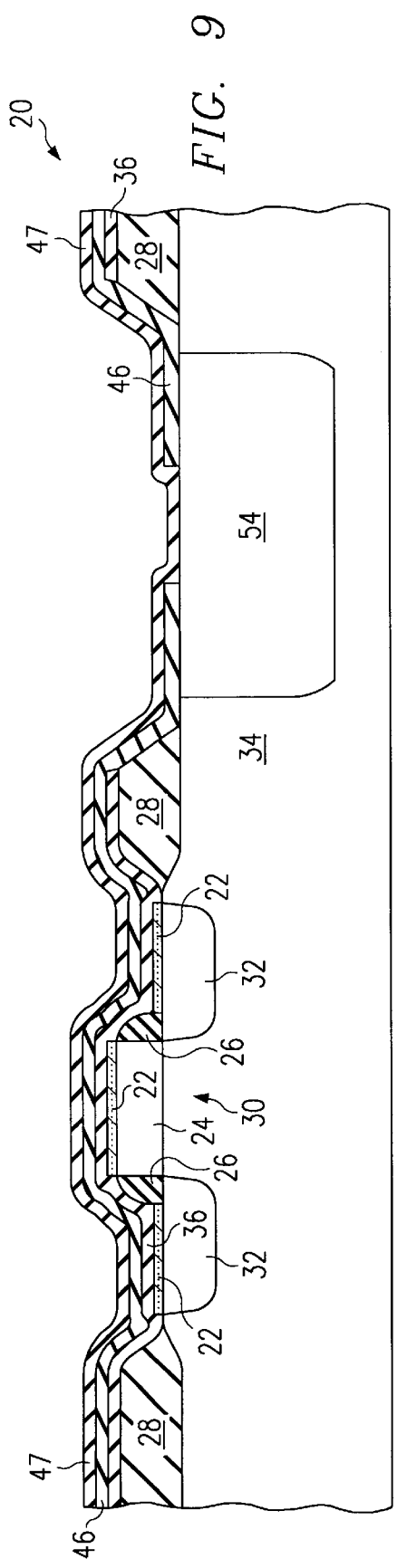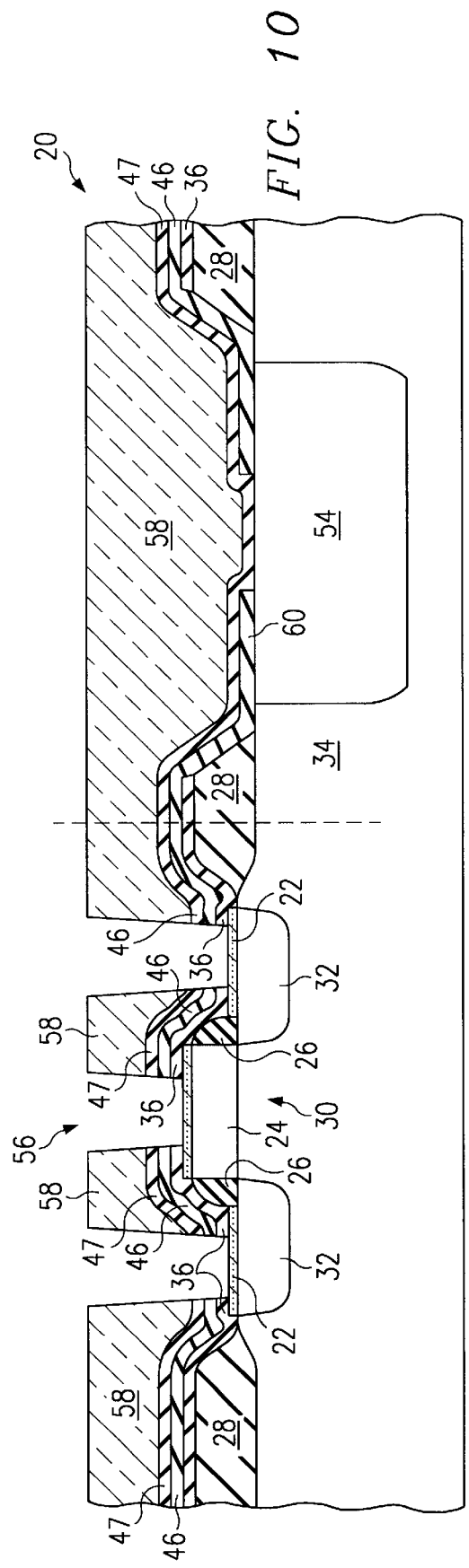

INTEGRATED CIRCUIT ISOLATION OF FUNCTIONALLY DISTINCT RF CIRCUITS

This application claims priority under 35 USC §119(e)(1) of provisional application No. 60/174,194 filed Dec. 31, 1999.

TECHNICAL FIELD OF THE INVENTION

This invention relates, in general, to integrated circuit structures and fabrication methods and, in particular, to techniques using the etching of porous silicon areas followed by a metal-lined dielectric backfill to provide isolation for circuit components, including isolation of functionally distinct circuit components from other functionally distinct circuit components and the semiconductor substrate to minimize parasitic AC coupling.

BACKGROUND OF THE INVENTION

Integrated circuits have been designed to ever-smaller geometries, and required to carry signals of ever-increasing frequencies. As integrated circuit components and signal lines are placed more closely together, and as the frequencies at which the components and signal lines operate are increased to radio frequencies (RF), the components and signal lines strongly couple electromagnetically to the substrate. This results in low power efficiency and restricts the maximum frequency at which the integrated circuit can function.

Previous methods have attempted to overcome the problem of coupling by increasing space between radiant components and receptive components, which results in larger die area and increased design costs. Other previous techniques have boosted the voltage levels of low voltage signals requiring a high degree of isolation resulting in lower power efficiency and relatively high power emissions that may couple undesirably with other signals.

Previous designs have used trenches to isolate components from a substrate; but such attempts typically fail to yield the 100 decibels (dB) of isolation necessary to integrate systems comprising functionally distinct circuits comprising mixed signal devices (such as base band, phase-locked-loop, or voltage controlled oscillators) or functionally distinct circuits requiring different power levels (such as transmitter or receiver) on the same substrate.

Even with removing or changing the substrate, or isolating the component from the substrate, the degrees of isolation necessary to integrate many RF systems on a single chip have not been achieved. Thus, commercially viable isolation of RF components from the substrate is now needed.

SUMMARY OF THE INVENTION

Therefore, a method for fabricating an integrated circuit having active components, high frequency conductors and isolation regions on a substrate is now needed; providing enhanced design performance while overcoming the aforementioned limitations of conventional methods.

The present invention provides integrated circuit structures and fabrication methods, including techniques using the etching of porous silicon areas and dielectric backfill to provide isolation for circuit components. The present invention provides for isolation of circuit components, including decoupling of RF passive components such as transmission lines on a circuit structure from a semiconductor substrate, to minimize parasitics. The present invention provides a method of fabricating an integrated circuit having active components, conductors and isolation regions on a substrate.

An embodiment of the present invention comprises patterning and etching a portion of at least one of the isolation regions to expose a first area of the substrate; depositing a layer of silicon carbide (or other material resistant to a porous silicon formation process) over the substrate including the first area; patterning and etching the silicon carbide mask layer to expose a second area of the substrate within the first area; anodizing the substrate to produce porous silicon so that the porous silicon lies in an area underneath the second area and extends only part way to the bottom surface of the substrate; etching the porous silicon to form a void; removing the silicon carbide mask layer to expose the isolation region; depositing a conductive layer over all exposed surfaces of the substrate comprising the void and the isolation region; depositing a dielectric layer over the conductive layer wherein the dielectric layer extends at least to the height of the isolation region; polishing the surface of the dielectric layer until the surface is planar and the top surface of the isolation region is exposed; and forming at least one patterned conductive layer over the surface of the dielectric layer that is coplanar with the surface of the isolation region.

In another embodiment of the present invention, the fabrication of an RF integrated circuit having active components, high frequency conductors and isolation regions on a substrate, comprises the forming of isolation regions in a substrate; forming active components in said substrate; patterning at least one of the isolation regions to expose a first area of said substrate; etching away some of the field oxide; forming a patterned masking layer of silicon carbide over said substrate, preferably by Plasma Enhanced Chemical Vapor Deposition (PECVD); patterning and etching the silicon carbide layer to expose a second area of the substrate within the first area; anodizing the porous silicon region; exposing the porous silicon from the backside, e.g., by back grinding; removing the porous silicon from backside; coating the walls of the void left by the removal of the porous silicon with a metal isolation layer, and spin-coating on glass to fill voids left by the removal.

The present invention may be used to form a structure that separates functionally distinct circuits on the substrate by traversing a boundary that fully segregates on the substrate the areas of each functionally distinct circuit.

BRIEF DESCRIPTION OF THE DRAWINGS

For a complete understanding of the present invention, including its features and advantages, reference is now made to the detailed description of the invention taken in conjunction with the accompanying drawings in which like numerals identify like parts and in which:

FIG. 1 is a schematic illustration of a transistor and field oxide structure;

FIG. 2 is a schematic illustration of the structure of FIG. 1, with an additional layer of silicon dioxide added, e.g., by a Plasma Enhanced Chemical Vapor Deposition (PECVD);

FIG. 3 is a schematic illustration of the structure of FIG. 2, with a layer of photoresist spun-on;

FIG. 4 is a schematic illustration of patterned photoresist leaving an exposed area of silicon dioxide over the site where Porous Silicate (PS) is to be formed;

FIG. 5 is a schematic illustration of silicon dioxide etched with tapered slope down to the Si substrate;

FIG. 6 is a schematic illustration of the process after the photoresist has been removed and after a layer of silicon carbide has been deposited;

FIG. 7 is a schematic illustration of the structure after a second layer of photoresist has been deposited and patterned;

FIG. 8 is a schematic illustration of Si area exposed after a carbon tetraflouride RIE etch and photoresist strip;

FIG. 9 is a schematic illustration of the structure after a porous silicon region has been anodized in the substrate;

FIG. 10 is a schematic illustration of vias cut through Intra-Layer Dielectric (ILD), SiC and TEOS to expose silicide areas on the transistor, using a three (3) step etch;

FIG. 17 is a schematic illustration of the structure of

FIG. 16 after the SiC has been removed;

DETAILED DESCRIPTION OF THE INVENTION

Figure 11:
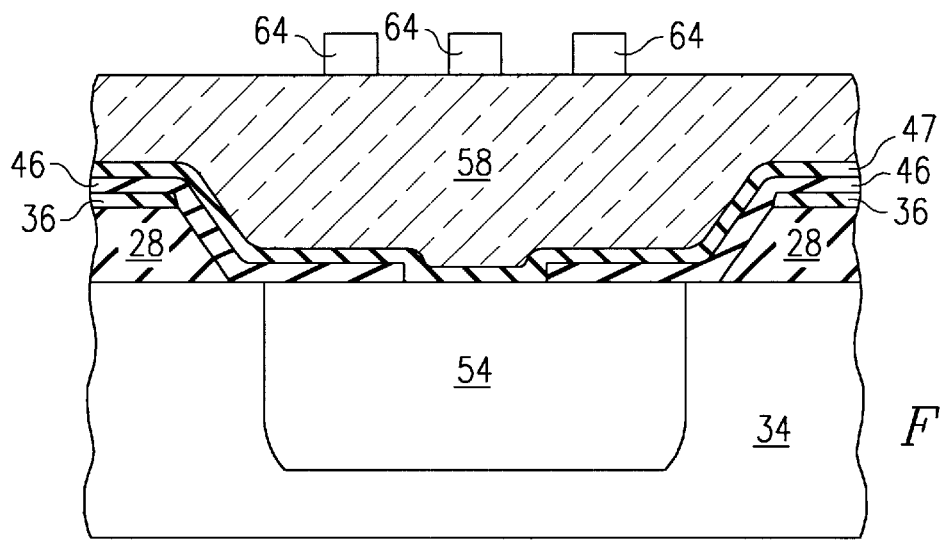
FIG. 11 is a schematic illustration after deposition of a first dielectric layer, and after inductor metallization has been deposited and patterned.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

A process for forming selective porous silicon (PS) areas according to a first embodiment of the invention will now be discussed in further detail. In this embodiment, the silicon carbide (SiC) masking layer is deposited after the transistor silicide process. Referring to FIG. 1, a semiconductor wafer during fabrication process is depicted as 20 showing substrate 34 having a transistor 21 having poly gate 24, side walls 26, gate oxide 30, and source/drain implants 32 formed therein. The device has been processed through isolation regions 28 and transistor 21 formation. Transistor 21 has been fabricated through silicide 22 formation and anneal. Isolation regions 28 are shown as field oxide regions.

Referring to FIG. 2, an oxide layer 36 may be deposited at this point. This oxide layer may be deposited by, for example, PETEOS, to a thickness on the order of 500–10,000 Å.

Next, a resist layer 38 is formed over the surface as shown in FIG. 3. The resist layer 38 is patterned as shown in FIG. 4 to expose an area 42 of isolation region 28. Area 42 is located over the desired PS site. Then, the oxide of isolation regions 28 is etched, preferably leaving sidewalls 44 having a slope between 30° and 60° degrees, as shown in FIG. 5. This may, for example, be accomplished in one of the following two ways: (1) an isotropic plasma etch using $CF_4/O_2$ or its equivalent or (2) an HF deglaze. Resist layer 38 is then removed using standard ash/cleanup processes. The above oxide pattern and etch steps may alternatively be performed prior to transistor formation.

A p+ diffusion of boron or similar dopant may be performed prior to the transistor formation to convert the p– epi to p+ with resistivity on the order of 0.01-cm. A shallow implant or diffusion of Boron will also be required on the backside of p–wafers to convert the backside surface to p+ and prevent charge inversion during the PS anodization step. If necessary, a deglaze to remove the boron or similar dopant contaminated oxide is then performed.

Referring to FIG. 6, a masking layer 46 of SiC is deposited over the structure. Layer 46 may typically have a thickness in the range of 500 to 5000 nm. The following process may be used: PECVD (plasma-enhanced chemical vapor deposition) using silane/methane, trimethylsilane, tetramethylsilane or other organosilicon precursor gas and Ar or He as carrier gas. The pressure may be on the order of 5 Torr. The gas flow may be in the range of 500–5000 sccm. RF power density may be on the order of 2 $W/cm^2$ (13.56 MHZ). The substrate temperature may be in the range of 200–500° C. If desired, a double deposition step (using the same conditions) may be used to reduce defects.

Next, a second resist mask 48 is formed over the SiC masking layer 46. The second resist mask 48 is patterned to expose a portion 50 of SiC masking layer 46 approximately in the center of where the PS region is desired, as shown in FIG. 7. The exposed portion 50 is generally significantly smaller than the width of the desired PS region. The relationship between the size of portion 50 and the desired PS region is optimized based on the PS formation process parameters.

Referring to FIG. 8, the exposed portion 50 of SiC masking layer 46 is removed. The following are some exemplary methods for removing portion 50 of SiC masking layer 46. First, $Cl_2/O_2$ based etch using a chamber pressure of 300 mTorr (gas flow 10–50 sccm), $O_2$ fraction 0–90%, and RF Power density 0.5–1 $W/cm^2$ (13.56 MHZ). Second, $CF_4/O_2/H_2$ based etch using an $O_2$ fraction 0–90%, $H_2$ flow 0–20 sccm, (fluorinated-$O_2$ gas flow 10–50 sccm), chamber pressure of 10–50 mTorr, and RF Power density 0.5–1 $W/cm^2$ (13.56 MHZ). Third, $SF_6/O_2/H_2$ based etch using $O_2$ fraction 0–90%, $H_2$ flow 0–20 sccm, (fluorinated-$O_2$ gas flow 10–50 sccm), chamber pressure of 10–50 mTorr and RF Power density 0.5–1 W /cm$^2$ (13.56 MHZ). Fourth, CHF$_3$/CF$_4$/Ar/O$_2$/H$_2$ based etch using an O$_2$ fraction 0–50%, H$_2$ flow 0–100 sccm, (fluorinated-Ar gas flow 50–200 sccm), chamber pressure of 10–50 mTorr, and RF Power density 0.5–1 W/cm$^2$ (13.56 MHZ). Second resist layer 52 is then removed to give the structure shown in FIG. 8.

Next, the PS regions 54 are formed by anodization, as shown in FIG. 9. The thickness of PS region 54 may vary between 10 μm and the wafer thickness, depending on the application. Typically, PS region 54 may be in the range of 10–200 μm. Any suitable anodization method may be used. For example, the porosity may be in the range of 45–70% and the current density may be in the range of 50–200 mA/cm2. Since the wafers used will typically be either p–, or have a p+ substrate with a p– epi layer on top, the electrolyte may have a larger than usual HF concentration, such as 50–70% (49%) HF. The electrolyte generally contains a surfactant such as isopropyl alcohol, and optionally additional water. Higher HF concentrations may be necessary to prevent the porosity of the PS in the p– from becoming too large and then cracking, while at the same time maintaining reasonable etch rates during anodization.

Under certain anodization conditions, the SiC mask may also crack as the etch proceeds beneath it. To avoid this, the anodization current density may initially be started at low levels and gradually increased to the desired level during the first 30–50% of the etch. This way the latter part of the etch may proceed at a high rate, again keeping the overall etch time reasonable. After the formation of the PS region 54, a capping layer of silicon carbide or other dielectric 47 may be deposited over the exposed porous silicon region as shown in FIG. 9.

Referring to FIG. 10, an interlayer dielectric (ILD) 58 is deposited. ILD 58 typically comprises a PECVD TEOS. However, other ILD materials may alternatively be used such as fluorosilicate glass, high density plasma TEOS, silicon nitride or spin-on glass.

The ILD 58 is then patterned and a contact etch is performed to etch through the ILD 58, SiC masking layer 46 and the oxide layer down to the silicide 22, as shown in FIG. 10. A multi-step etch is used, because an etch that will remove both SiC and SiO$_2$ will probably have poor selectivity between the dielectrics and the silicide, and most likely cut into the silicide. Without the multi-step etch, poor process control may result.

Referring to FIG. 11, a schematic illustration of only the right portion of the preceding figures is shown after deposition of a first dielectric layer after inductor 64 metallization has been deposited and patterned.

Figure 12:
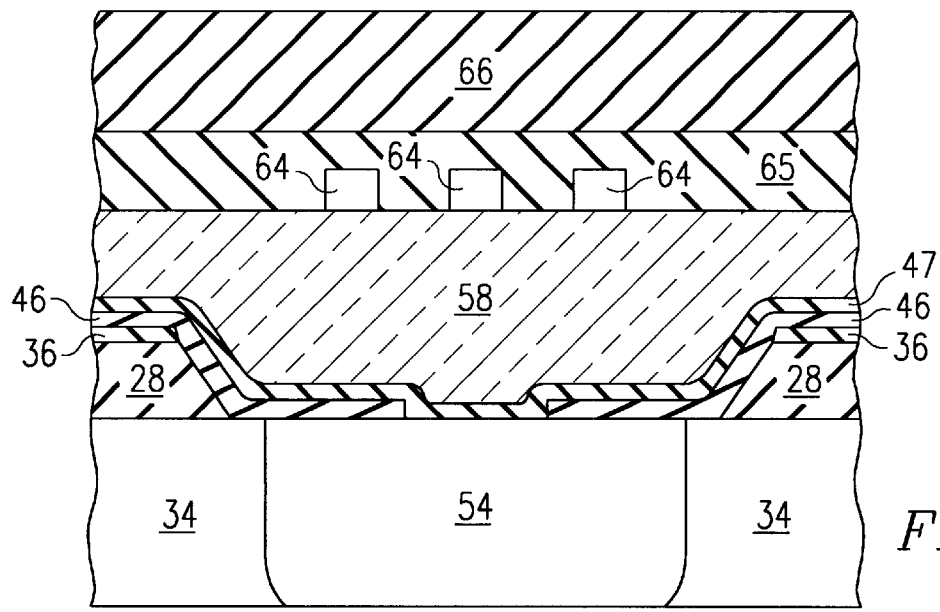
FIG. 12 is a schematic illustration of the structure, after deposition of a second dielectric layer and after a support layer of, e.g., photoresist, has been added on the wafer topside and after grinding of the wafer backside.

Referring to FIG. 12, a second dielectric layer 65 is added followed by a strengthening layer of photoresist 66 and then followed by a back-grinding 62 step that exposes the porous silicon from the backside.

Figure 13:
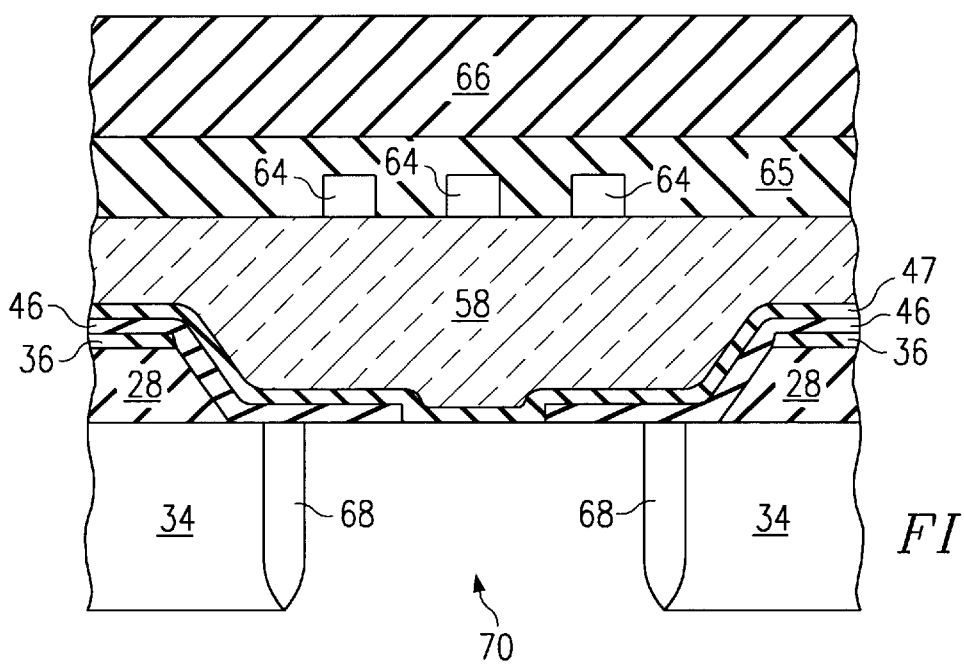
FIG. 13 is a schematic illustration of the structure after the porous silicon has been removed, e.g., by backside wet-etching.
Figure 14:
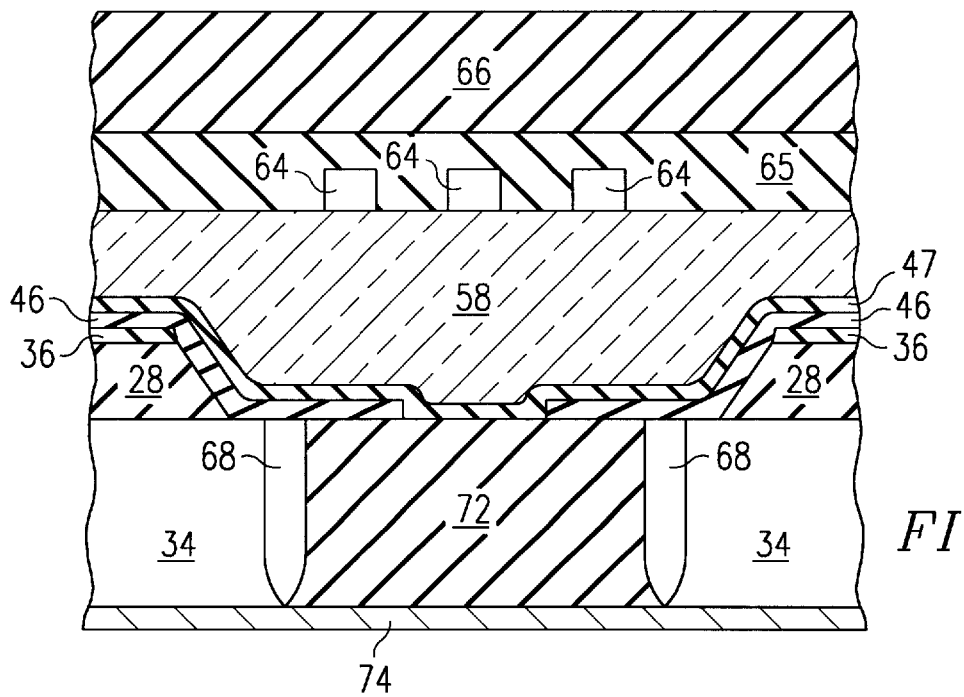
FIG. 14 is a schematic illustration of the structure after a metal film has been deposited on the backside and after a dielectric has been used in a backside filling of the void left by the porous silicon removal, and after backside metallization.

Referring to FIG. 13, the exposed porous silicon is then removed from the backside by the process of wet etching to leave a void 70. In this embodiment, an isotropic deposition of metal, e.g. aluminum by PECVD is used to form conductive layer 68 on the void walls for additional RF shielding. Voids left by removal of the porous silicon are back-filled with dielectric fill 72 and planarized as shown in FIG. 14. The final step includes metallization of the backside 74. The steps of back-grinding, removal of the porous silicon, and back-filling with dielectric may all be done in the same machine, to avoid handling of the wafer while it is in a relatively fragile condition.

In a second embodiment, the silicon carbide (SiC) masking layer is deposited after the transistor silicide process. Referring to FIG. 1, a semiconductor wafer during fabrication process is depicted as 20 showing substrate 34 having a transistor 21 having poly gate 24, side walls 26, gate oxide 30, and source/drain implants 32 formed therein. The device has been processed through isolation regions 28 and transistor 21 formation. Transistor 21 has been fabricated through silicide 22 formation and anneal. Isolation regions 28 are shown as field oxide regions.

Referring to FIG. 2, an interlayer dielectric (ILD) 36 may be deposited at this point as a Pre-Metal Deposition (PMD) layer. This layer may be deposited by, for example, PETEOS, to a thickness on the order of 3000–10,000 Å. The resulting surface may then be planarized by Chemical Mechanical Polishing (CMP).

Next, a resist layer 38 is formed over the surface as shown in FIG. 3. The resist layer 38 is patterned as shown in FIG. 4 to expose an area 42 over the isolation region 28. Area 42 is located over the desired PS site. Then, the oxide of isolation regions 28 is wet oxide etched (using HF), preferably leaving sidewalls 44 having a slope between 300 and 600 degrees, as shown in FIG. 5. This may, for example, be accomplished in one of the following two ways: (1) an isotropic plasma etch using CF$_4$/O$_2$ or its equivalent or (2) an HF deglaze. Resist layer 38 is then removed using standard ash/cleanup processes.

A p+ diffusion of boron or similar dopant may be performed prior to the transistor formation to convert the p– epi to p+ with resistivity on the order of 0.01-cm. A shallow implant or diffusion of Boron will also be required on the backside of p– wafers to convert the backside surface to p+ and prevent charge inversion during the PS anodization step. If necessary, a deglaze to remove the boron or similar dopant contaminated oxide is then performed.

Referring to FIG. 6, a masking layer 46 of SiC is deposited over the structure. Layer 46 may typically have a thickness in the range of 500 to 5000 Å. The following process may be used: PECVD (plasma-enhanced chemical vapor deposition) using silane/methane, trimethylsilane, tetramethylsilane or other organosilicon precursor gas and Ar or He as carrier gas. The pressure may be on the order of 5 Torr. The gas flow may be in the range of 500–5000 sccm. RF power density may be on the order of 2 W/cm$^2$ (13.56 MHZ). The substrate temperature may be in the range of 200–500° C. If desired, a double deposition step (using the same conditions) may be used to reduce defects.

Next, a second resist mask 48 is formed over the SiC masking layer 46. The second resist mask 48 is patterned to expose a portion 50 of SiC masking layer 46 approximately in the center of where the PS region is desired, as shown in FIG. 7. The exposed portion 50 is generally significantly smaller than the width of the desired PS region. The relationship between the size of portion 50 and the desired PS region is optimized based on the PS formation process parameters. The width of the desired PS region may be smaller than the width of the substrate 34 that is directly covered by the SiC masking layer; the width of substrate 34 in excess of the width of the desired PS region may be used in later process steps to provide a suitable horizontal surface upon which structures for contacting upper-layer metallization may be made.

Referring to FIG. 8, the exposed portion 50 of SiC masking layer 46 is removed. The following are some exemplary methods for removing portion 50 of SiC masking layer 46. First, Cl$_2$/O$_2$ based etch using a chamber pressure of 300 mTorr (gas flow 10–50 sccm), $O_2$ fraction 0–90%, and RF Power density 0.5–1 $W/cm^2$ (13.56 MHZ), may be used. Second, $CF_4/O_2/H_2$ based etch uses an $O_2$ fraction 0–90%, $H_2$ flow 0–20 sccm, (fluorinated-$O_2$ gas flow 10–50 sccm), with chamber pressure of 10–50 mTorr and RF Power density 0.5–1 $W/cm^2$ (13.56 MHZ). Third, $SF_6/O_2/H_2$ based etch uses $O_2$ fraction 0–90%, $H_2$ flow 0–20 sccm, (fluorinated-$O_2$ gas flow 10–50 sccm), with chamber pressure of 10–50 mTorr and RF Power density 0.5–1 $W/cm^2$ (13.56 MHZ). Fourth, $CHF_3/CF_4/Ar/O_2/H_2$ based etch uses an $O_2$ fraction 0–50%, $H_2$ flow 0–100 sccm, (fluorinated-Ar gas flow 50–200 sccm) with chamber pressure of 10–50 mTorr and RF Power density 0.5–1 $W/cm^2$ (13.56 MHZ). Second resist layer 52 is then removed to give the structure shown in FIG. 8.

Figure 15:
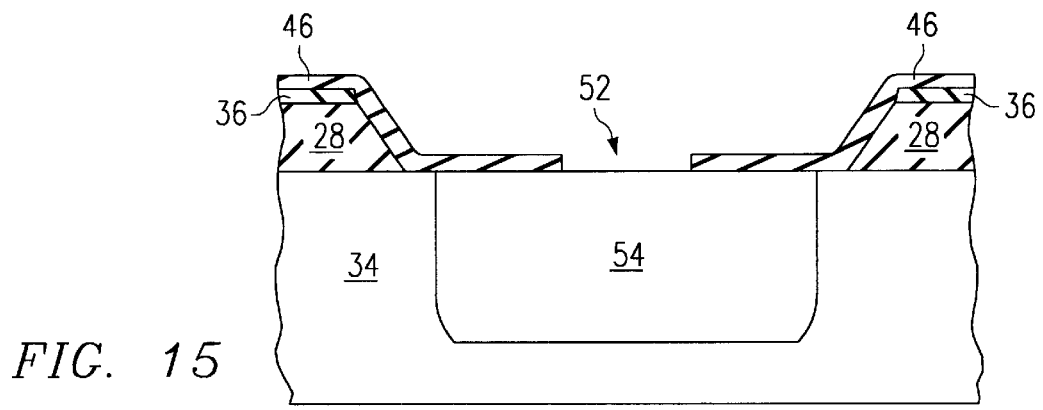
FIG. 15 is a schematic illustration of the structure of FIG. 8 after a portion of the substrate has been anodized from the top of the wafer.

Next, the PS regions 54 are formed by anodization, as shown in FIG. 15, which is a schematic illustration of only the right portion of the preceding figures. The thickness of PS region 54 may vary between 10 $\mu$m and the wafer thickness, depending on the application. Typically, PS region 54 may be in the range of 10–300 $\mu$m. Any suitable anodization method may be used. For example, the porosity may be in the range of 45–70% and the current density may be in the range of 50–200 mA/cm2. Since the wafers used will typically be either p–, or have a p+ substrate with a p– epi layer on top, the electrolyte may have a larger than usual HF concentration, such as 50–70% (49%) HF. The electrolyte generally contains a surfactant such as isopropyl alcohol, and possibly additional water. Higher HF concentrations may be necessary to prevent the porosity of the PS in the p– from becoming too large and then cracking, while at the same time maintaining reasonable etch rates during anodization. Preferably, the anodization chemistry will comprise a ratio by volume of 60:30:10 of an HF solution (~49%), an alcohol, and deionized water.

Under certain anodization conditions, the SiC mask may also crack as the etch proceeds beneath it. To avoid this, the anodization current density may initially be started at low levels and gradually increased to the desired level during the first 30–50% of the etch. This way the latter part of the etch may proceed at a high rate, again keeping the overall etch time reasonable.

Figure 16:
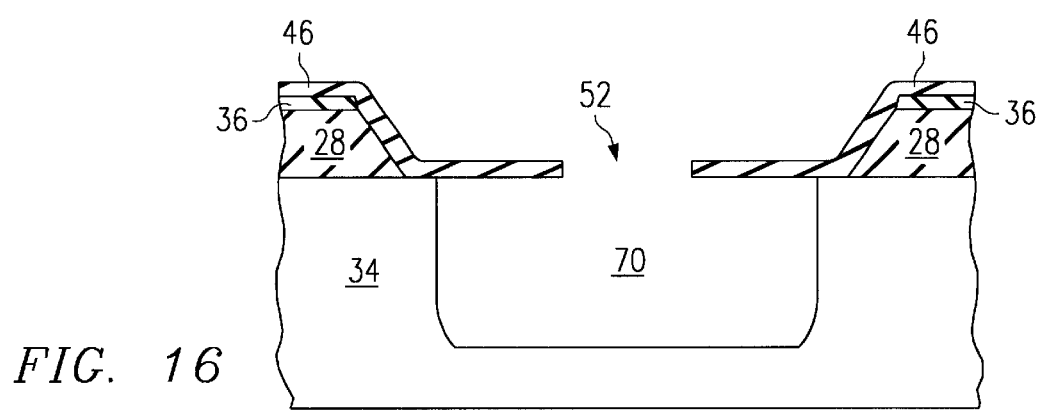
FIG. 16 is a schematic illustration of the structure of FIG. 15 after the porous silicon has been removed.
Figure 17:
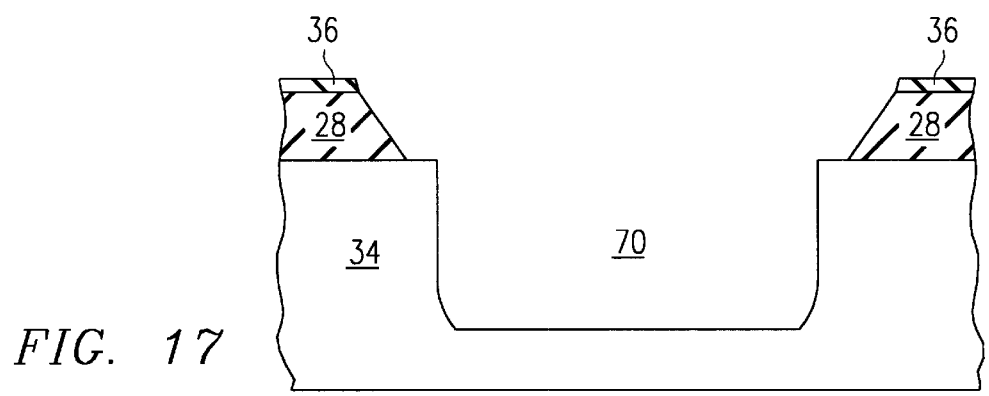

Referring to FIG. 16, the exposed porous silicon is then removed by the process of wet etching to leave a void 70. The etch chemistry may comprise a ration by volume of 10:6:50 of a buffered HF solution (~40% $NH_4F$ and 4.5% HF), an alcohol, and a peroxide solution (~30% $H_2O_2$). The SiC masking layer 46 may then be removed by a chlorine-based Reactive Ion Etch (RIE) as shown in FIG. 17.

Figure 18:
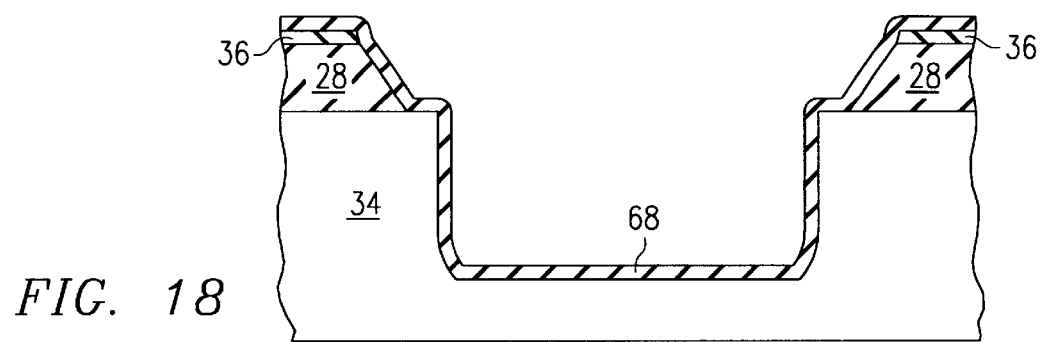
FIG. 18 is a schematic illustration of the structure of FIG. 17 after a conductive isolation layer has been deposited.

In FIG. 18, a layer of metal, e.g., aluminum by PECVD, of 5000–10000 Å is used to form metal isolation layer 68 over exposed surfaces. If it is desired to control the degree of isolation between metal isolation layer 68 and substrate 34, a layer of TEOS (not shown) of 10–500 Å may be deposited on substrate 34 before metal isolation layer 68 is formed. An adhesion or barrier layer (not shown) should also be deposited on substrate 34 before metal isolation layer 68 is formed. The adhesion layer may be comprised of a layer of TiN of 10–500 Å, or any of the variety of commonly used silicides.

Figure 19:
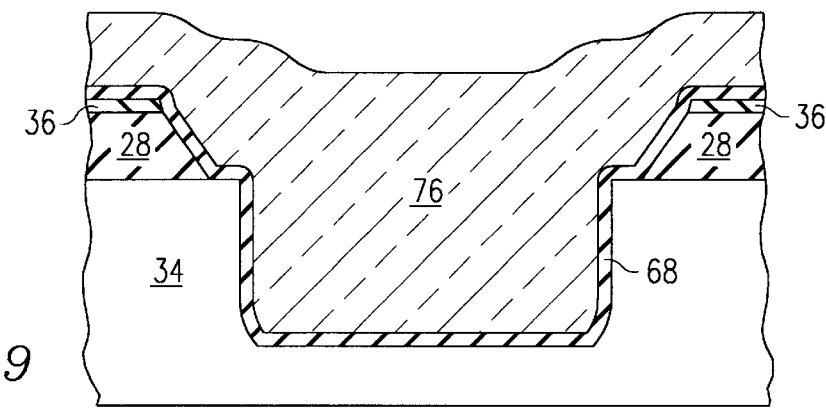
FIG. 19 is a schematic illustration of the structure of FIG. 18 after a dielectric backfill.

In FIG. 19, a dielectric layer 76 such as an SOG (Spun-On-Glass) is deposited over the conductive layer so that dielectric layer 76 extends at least to the height of isolation region 28 and interlayer dielectric 36. The SOG may be densified by baking it in a furnace at between 200° and 330° Celsius for one hour.

Figure 20:
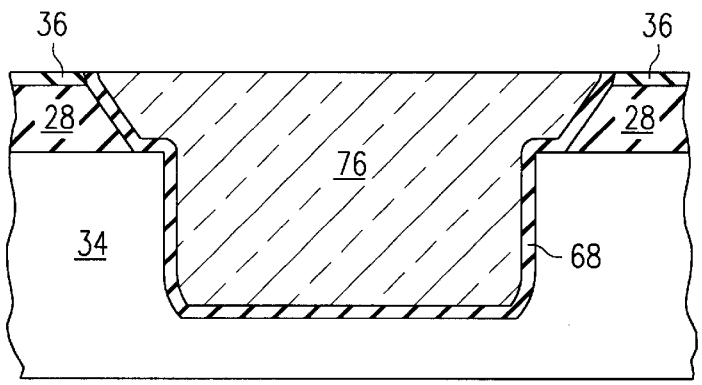
FIG. 20 is a schematic illustration of the structure of FIG. 19 after the dielectric has been planarized.

Referring to FIG. 20, the surface of wafer 20 has been planarized by an oxide, then AL-TiN CMP down to interlayer dielectric 36 of isolation region 28.

Figure 21:
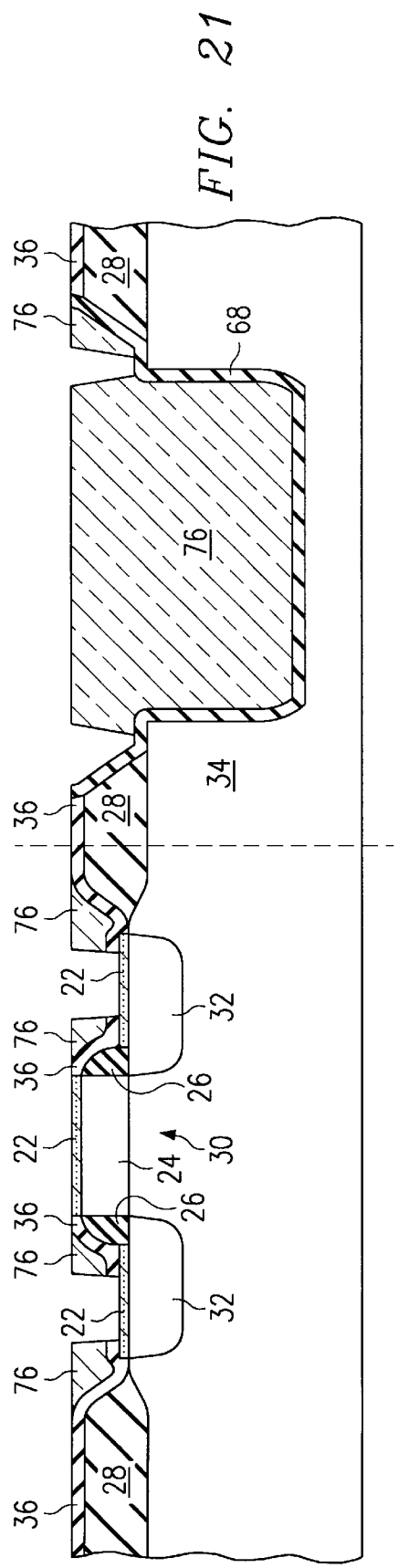
FIG. 21 is a schematic illustration of the structure of FIG. 20 after the dielectric has been patterned and etched to expose the silicide regions of the transistor and contact regions of the conductive isolation layer.

As shown in FIG. 21, dielectric layer 76 may be patterned and etched to expose silicide regions 22 of the transistor structure as well as to expose metal isolation layer 68 so that silicide regions 22 and metal isolation layer 68 can have metal contacts attached to them.

Figure 22:
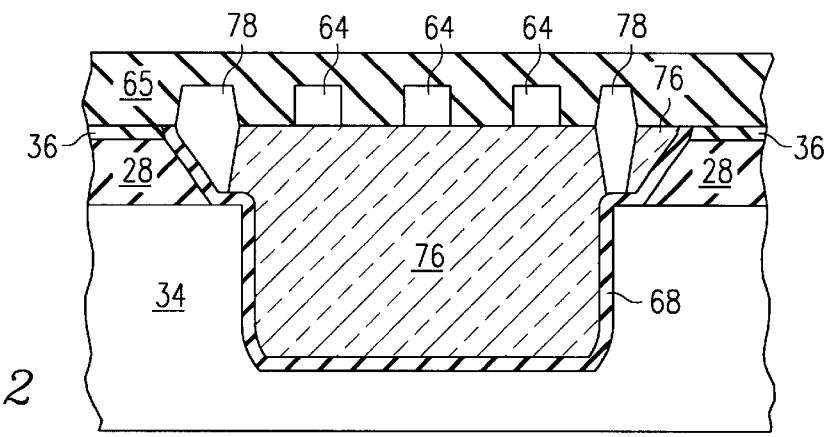
FIG. 22 is a schematic illustration of the structure of FIG. 21 after inductors have been formed during metallization and a covering dielectric deposited.

Referring to FIG. 22, a schematic illustration of only the right portion of the preceding figure is shown after deposition of a first dielectric layer after inductor 64 metallization has been deposited and patterned. Inductor 64 as shown represents a portion of a passive RF component. Contacts 78 connect conductive isolation layer 68 with the return path for an RF signal (not shown). If inductor 64 represents an RF transmission line, then groups of contacts 78 ideally may be made only at each end of the transmission line.

Figure 23:
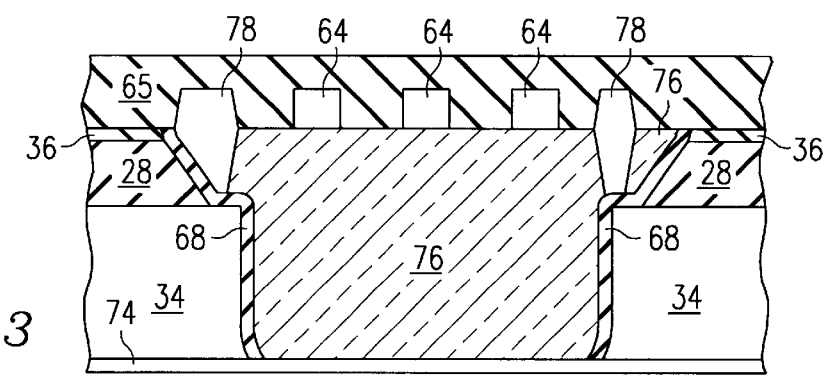
FIG. 23 is a schematic illustration of the structure of FIG. 22 after back-grinding and metallizing the bottom surface of the wafer.

Referring to FIG. 23, wafer 20 is thinned by a back-grinding step which optionally exposes dielectric layer 76 depending on extent of the back-grinding. If dielectric layer 76 has been exposed, then metallization of the backside 74 is performed.

Figure 24:
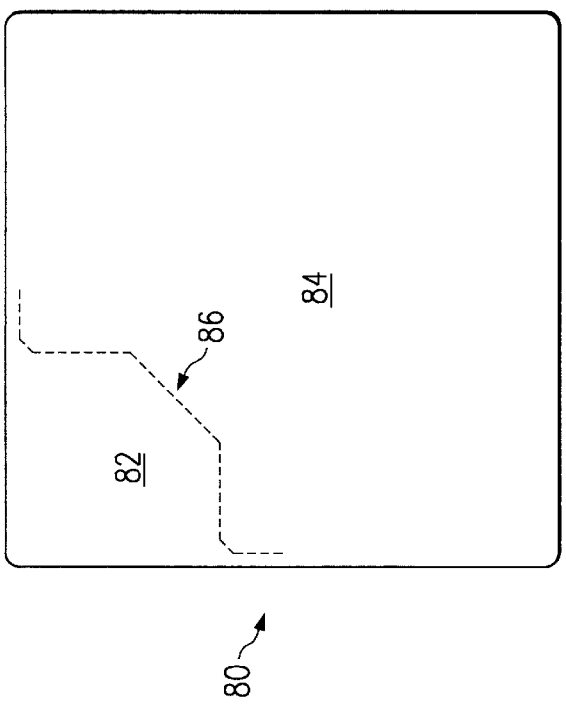
FIG. 24 is a schematic illustration of a die containing functionally distinct circuits that are segregated by a trench formed according to this invention.

FIG. 24 shows a die 84 (cut from wafer 20) with areas 82 and 84 of functionally distinct circuits. The methods of both embodiments may provide a structure ("trench") that traverses a line 86 that completely segregates areas 82 and 84 from each other. Or it may surround a section of the die, within the scribeline. Because the structure may weaken the structural integrity of the die, interstices of unchanged substrate material may be allowed to remain along the path of the trench. The length of the interstices will be less than the length of the segments of the trench structure so as to provide an effective Faraday cage that blocks undesirable RF signals. Trench segments should be 100–200 $\mu$m in length and interstices 10–50 $\mu$m in length; smaller segment-to-interstice length ratios will be less effective. The path of line 86 may be situated to lessen the susceptibility to breaking of the die by forces encountered in handling such as dicing and packaging.

While the making and using of various embodiments are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

What is claimed is:

1. A method of fabricating an integrated circuit having active components, conductors and isolation regions on a substrate, comprising the steps of:

forming a portion of at least one of the isolation regions to expose a first area of the substrate;

depositing a mask layer over the integrated circuit including the first area;

forming the mask layer to expose a second area of the substrate within the first area;

converting a portion of the substrate to a selectively etchable material in an area subjacent to the second area and extending only partially to the bottom surface of the substrate;

selectively etching the selectively etchable material to form a void;

removing the mask layer to expose the isolation region;

depositing a conductive layer over all exposed surfaces of the substrate comprising the void and the isolation region;

depositing a dielectric layer over the conductive layer wherein the dielectric layer extends at least to the height of the isolation region;

polishing the surface of the dielectric layer until the surface is planar and the top surface of the isolation region is exposed; and forming at least one patterned conductive layer over the surface of the dielectric layer that is coplanar with the surface of the isolation region, wherein the structure formed by this method separates functionally distinct circuits on the substrate by traversing a boundary that fully segregates on the substrate the areas of each the functionally distinct circuit.

2. The method of claim 1, wherein the mask layer is comprised of silicon carbide.

3. The method of claim 2, wherein the mask layer has a thickness between 500 Å and 5000 Å.

4. The method of claim 2, wherein the substrate is converted to porous silicon.

5. The method of claim 4, wherein the mask layer is comprised of silicon carbide.

6. The method of claim 5, wherein the conductive layer is comprised of metal.

7. The method of claim 6, wherein the step of patterning and etching the isolation region forms angled sidewalls having a slope between 30° and 60° degrees.

8. The method of claim 5, wherein the wafer is thinned by back-grinding to expose the dielectric backfilling the void.

9. The method of claim 8, wherein the bottom surface of the wafer is metallized.

10. A method of fabricating an integrated circuit having active components, conductors and isolation regions on a substrate, comprising the steps of:

forming a portion of at least one of the isolation regions to expose a first area of the substrate;

depositing a mask layer over the integrated circuit including the first area;

forming the mask layer to expose a second area of the substrate within the first area;

converting a portion of the substrate to a selectively etchable material in an area subjacent to the second area and extending therethrough to the bottom surface of the substrate;

forming at least one dielectric layer over the substrate;

forming at least one patterned conductive layer over the dielectric layer;

selectively etching the selectively etchable material from the backside to form a void; and depositing a conductive isolation layer on the vertical surfaces of the void, wherein the structure formed by this method separates functionally distinct circuits on the substrate by traversing a boundary that fully segregates on the substrate the areas of each the functionally distinct circuit.

11. The method of claim 10, wherein the structure provided by this method provides interstices of unchanged substrate to retain structural integrity of the substrate.

12. The method of claim 11, wherein the interstices are between 5 and 75 $\mu$m in length and are provided every at intervals of between 100 and 300 $\mu$m.

13. The method of claim 10, wherein the selectively etchable material extends only partially to the bottom surface of the substrate, and wherein the substrate is thinned from the bottom surface to expose the selectively etchable material.

14. The method of claim 10, wherein the substrate is converted to porous silicon.

15. The method of claim 14, wherein the mask layer is comprised of silicon carbide.

16. The method of claim 14, wherein the void left by the removal is backfilled with a dielectric.

17. The method of claim 14, wherein the conductive layer is comprised of metal.

18. The method of claim 14, wherein the step of patterning and etching the isolation region forms angled sidewalls having a slope between 30° and 60° degrees.

19. A method of producing an integrated circuit having active components, conductors and isolation regions on a substrate, comprising the steps of:

forming a portion of at least one of the isolation regions to expose a first area of the substrate;

depositing a layer of silicon carbide over the substrate including the first area;

forming the silicon carbide layer to expose a second area of the substrate within the first area;

forming a porous silicon region in the second area using HF;

forming at least one dielectric layer over the substrate;

forming at least one patterned metallization layer over the dielectric layer;

removing the porous silicon from backside to form a void;

depositing a conductive isolation layer on the vertical surfaces of the void; and backfilling remaining space in the void left by the removal and the conductive isolation layer with a dielectric, wherein the structure formed by this method separates functionally distinct circuits on the substrate by traversing a boundary that fully segregates on the substrate the areas of each the functionally distinct circuit.

20. The method of claim 19, wherein the forming an oxide layer over the substrate patterned metallization comprises forming RF passive components, and wherein the removing of the porous silicon and backfilling with dielectric decouples the RF passive components on the circuit structure from the semiconductor substrate to minimize parasitics.

* * * * *